United States Patent

[11] 3,622,878

[72] Inventors Roger J. Feulner
Mount Prospect, Ill.;
Troy L. Pegram, Wabash, Ind.
[21] Appl. No. 7,475
[22] Filed Feb. 2, 1970
[45] Patented Nov. 23, 1971
[73] Assignee Honeywell Inc.
Minneapolis,

[54] METHOD OF CALIBRATING AN ELECTRICAL CIRCUIT
2 Claims, 4 Drawing Figs.

[52] U.S. Cl. .......... 324/81
[51] Int. Cl. .......... G01r 23/00
[50] Field of Search .......... 324/81, 57 Q; 331/44; 29/593

[56] References Cited
UNITED STATES PATENTS

| | | | |
|---|---|---|---|
| 1,176,925 | 3/1916 | Pickard | 324/81 X |
| 1,971,310 | 8/1934 | Barber | 324/81 X |
| 3,178,636 | 4/1965 | Varian et al. | 324/81 X |

*Primary Examiner*—Alfred E. Smith
*Attorneys*—Lamont B. Koontz and Clyde C. Blinn

ABSTRACT: A method or process of calibrating an oscillating circuit having a predetermined frequency or period output signal for a predetermined input signal. The circuit has two capacitors connected in parallel and a variable impedance whereby upon adjustment of the variable impedance to obtain a predetermined frequency output calibration can be selectively accomplished with both capacitors in the circuit or after removing one of the capacitors.

Figure 1:
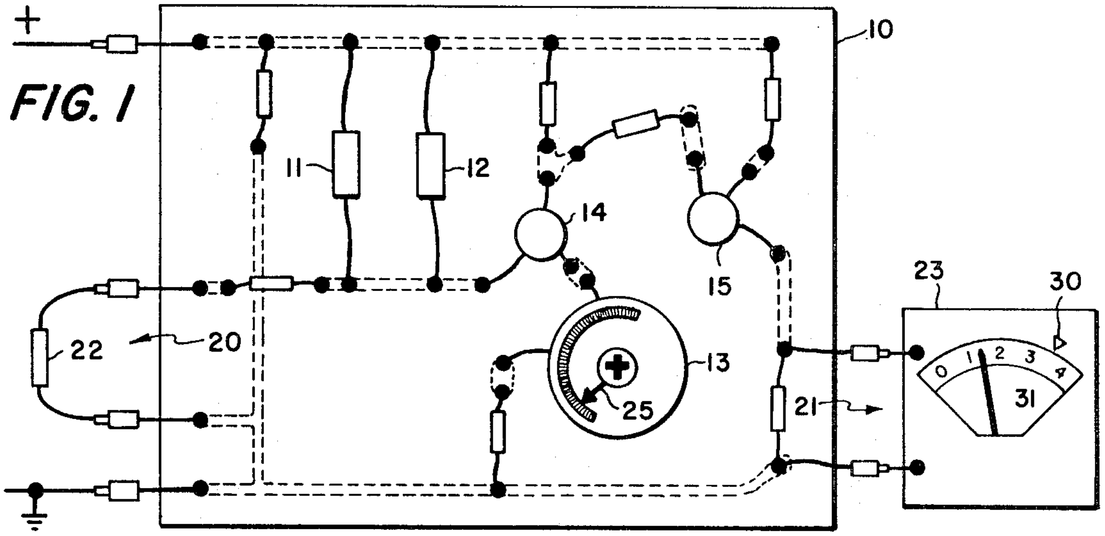

INVENTORS
ROGER J. FEULNER
TROY L. PEGRAM
BY Clyde C. Blinn
ATTORNEY

METHOD OF CALIBRATING AN ELECTRICAL CIRCUIT

BACKGROUND AND SUMMARY OF THE INVENTION

In the manufacture of electrical circuits, the calibration of such electrical circuits has been done by the adjustment of the values of various components in the circuit or the removal of certain components to provide for a predetermined output with a predetermined input signal. The present invention is concerned with the calibration of an oscillation circuit to provide a predetermined output frequency or period for a predetermined input signal. The circuit has two fixed capacitors and a variable impedance whereby the adjustment of the output is accomplished by the adjustment of the variable impedance with both capacitors in the circuit or with one capacitor removed.

Figure 2:
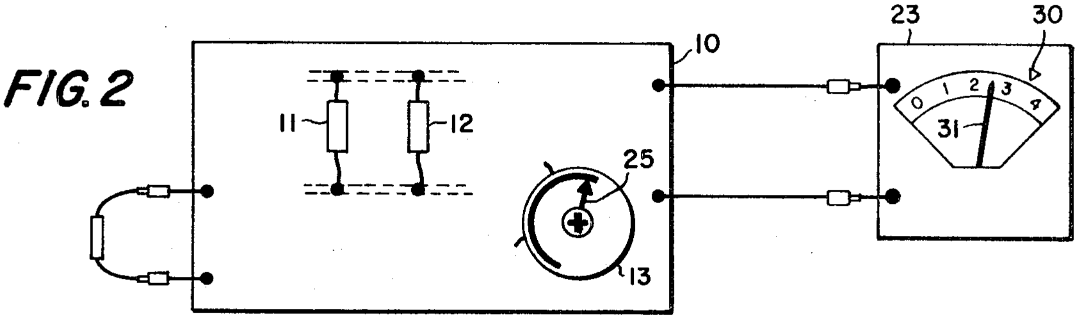
Figure 3:
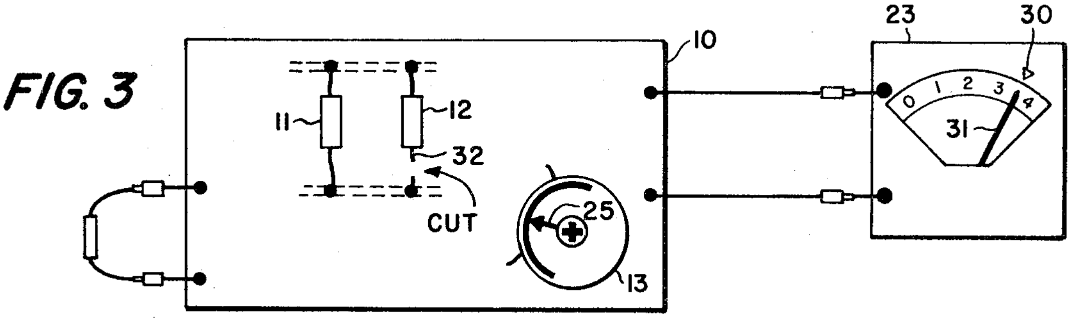
Figure 4:
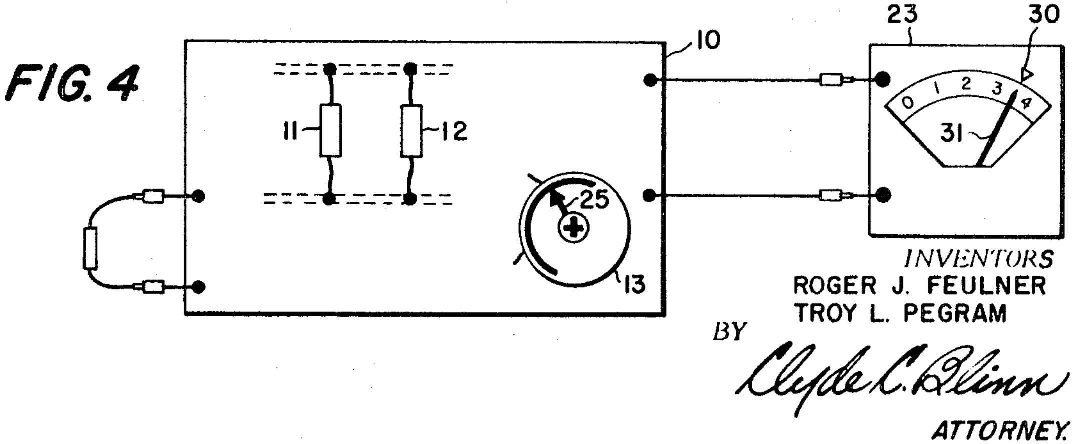

The invention is disclosed in the drawing comprising:

FIG. 1 showing the electrical oscillating circuit on a card with an input circuit connected to a resistor and the output connected to a meter, FIG. 2 shows the electrical circuit of FIG. 1 wherein the variable impedance is adjusted to one extreme without having the meter indication at the desired level, FIG. 3 is the electrical circuit of FIG. 1 with the one capacitor removed from the circuit and the variable impedance is adjusted to provide the desired meter indication, and FIG. 4 shows the electrical circuit of FIG. 1 wherein the desired indication is provided when the variable impedance is adjusted with the two capacitors in the circuit.

DESCRIPTION OF THE INVENTION

Referring to FIG. 1, a printed circuit card 10 contains an electrical oscillating circuit. The circuit contains various components including two capacitors 11 and 12 connected in parallel, a variable impedance or resistance element 13, a pair of semiconductors or transistors 14 and 15, input terminals 20 and output terminals 21. The various components are attached to the printed circuit card by means of automatic equipment such a dip soldering to provide the circuit on the circuit board in a mass production operation.

When the circuit of circuit board 10 has a resistance element 22 connected to input 20 and a meter 23 for measuring the frequency, which is indicative of period, of the alternating output signal from output terminals 21, the adjustment of the variable impedance 13 is made to calibrate the circuit to provide a predetermined frequency output for a predetermined resistance 22.

Since the circuit is made in a mass production operation with automatic equipment, the calibration of the circuit is not readily accomplished by removing certain components and substituting components with different values during the calibration operation.

The oscillating circuit or card 10 is calibrated in a method or process with the steps or stages as follows:

First, with a predetermined input resistance 22, the human operator adjusts the position of wiper 25 on variable impedance 13 to provide a predetermined output as indicated by indicator 30 on meter 23. Second, if by the adjustment of wiper 25 to a position as shown in FIG. 2 without providing the output on meter 23 to cause needle 31 to move in line with indicator 30, the human operator cuts or removes capacitor 12 from the circuit by cutting the wire at 32 with a wire cutter. Third, upon a subsequent adjustment of wiper 25, a desired output at meter 23 is obtained to align needle 31 with indicator 30, the calibration of the circuit on card 10 is accomplished.

During the first calibration step as described in connection with FIG. 1, if upon the movement of the wiper 25 to a position as shown in FIG. 4, the desired output of meter 23 is obtained by the alignment of needle 31 with indicator 30, nothing further is done and the capacitors 11 and 12 are left in the circuit on card 10.

We claim:

1. In a method of calibration of a resistance-to-period oscillating circuit in which the period of the output signal of the circuit output is indicative of the input signal to the input of the circuit comprising at least two capacitors and a variable impedance comprising the following steps:
   - adjusting the variable impedance with the two capacitors in the circuit in an attempt to obtain an output signal with a predetermined period for a predetermined input signal
   - cutting a capacitor out of the circuit when said circuit can not be calibrated to provide said predetermined period, and
   - adjusting the variable impedance with only one of the capacitors in the circuit to calibrate said circuit to provide an output with said predetermined period with said predetermined input signal.

2. In a calibration process for an electric circuit on a printed circuit board with the circuit component assembled in mass production the circuit board having at least two capacitors connected in parallel and a variable impedance wherein the circuit upon having a predetermined input signal provides an alternating output signal with a predetermined period, steps of the process comprising:
   - the manual adjustment of the variable impedance to provide the output signal with a predetermined period for the predetermined input signal,
   - the removal of one of the capacitors manually if said output signal with said predetermined period is not accomplished, and
   - the adjustment of the variable impedance to provide the predetermined period with the predetermined input.

* * * * *